US012575242B2

(12) United States Patent
Kim et al.

(10) Patent No.: US 12,575,242 B2
(45) Date of Patent: Mar. 10, 2026

(54) DISPLAY DEVICE

(71) Applicant: Samsung Display Co., Ltd., Yongin-si (KR)

(72) Inventors: Eun Hyun Kim, Suwon-si (KR); Eun Hye Ko, Yongin-si (KR); Se Ryeong Kim, Asan-si (KR); Eok Su Kim, Seoul (KR); Sun Hee Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 891 days.

(21) Appl. No.: 17/267,783

(22) PCT Filed: Jul. 23, 2019

(86) PCT No.: PCT/KR2019/009108
§ 371 (c)(1),
(2) Date: Feb. 10, 2021

(87) PCT Pub. No.: WO2020/036330
PCT Pub. Date: Feb. 20, 2020

(65) Prior Publication Data
US 2021/0167125 A1      Jun. 3, 2021

(30) Foreign Application Priority Data
Aug. 16, 2018      (KR) ........................ 10-2018-0095664

(51) Int. Cl.
*H01L 27/15*          (2006.01)
*H10H 20/815*       (2025.01)
(Continued)

(52) U.S. Cl.
CPC ........ *H10H 29/142* (2025.01); *H10H 20/815* (2025.01); *H10H 20/8312* (2025.01); *H10H 20/857* (2025.01)

(58) Field of Classification Search
CPC ..... H01L 27/156; H01L 33/12; H01L 33/382; H01L 33/62; H01L 27/1225;
(Continued)

(56) References Cited

U.S. PATENT DOCUMENTS 8,455,876 B2      6/2013   Choi et al.
9,129,927 B2      9/2015   Gupta et al.
(Continued)

FOREIGN PATENT DOCUMENTS

CN          105408813 A   *   3/2016   ......... G02F 1/13624
CN          107112330 A       8/2017
(Continued)

OTHER PUBLICATIONS

Office Action, Chinese Application No. 201980054011.9, issued on Jun. 13, 2024, 8 pps.

*Primary Examiner* — Ermias T Woldegeorgis
(74) *Attorney, Agent, or Firm* — Womble Bond Dickinson (US) LLP

(57)          ABSTRACT

A display device according to some embodiments includes: a substrate; a first transistor and a second transistor disposed on the substrate and spaced apart from each other; a first electrode connected to one of the first transistor and the second transistor; a second electrode overlapping the first electrode; and a light emitting layer between the first electrode and the second electrode, wherein the first transistor may include: a first semiconductor layer on the substrate; a first gate electrode on the first semiconductor layer; and a first source electrode and a first drain electrode connected to the first semiconductor layer, and the second transistor may include: a second semiconductor layer on the substrate; a second gate electrode on the second semiconductor layer; and a second source electrode and a second drain electrode connected to the second semiconductor layer, and the first (Continued)

360 365 191 370 270 400

180 173a 175a 175b 124b 173b
160 61 62 64 63
Ta Tb
142
141
111
110
130a 125a 154a 153b 151b 152b
157b
PA1          PA2 gate electrode and the second semiconductor layer may be on the same layer.

9 Claims, 9 Drawing Sheets

(51) Int. Cl.
    *H10H 20/831*         (2025.01)
    *H10H 20/857*         (2025.01)
    *H10H 29/14*           (2025.01)

(58) Field of Classification Search
    CPC ............... H01L 27/1251; H01L 27/124; H01L
            29/78606; H01L 29/78645; H01L
          29/78672; H01L 29/7869; H10K 59/1213;
           H10K 59/123; H10K 50/00; H10H
          29/142; H10H 20/815; H10H 20/8312;
          H10H 20/857; H10D 86/441; H10D
          86/423; H10D 86/471; H10D 86/60;
          H10D 30/6704; H10D 30/6733; H10D
              30/6745; H10D 30/6755
    See application file for complete search history.

(56) References Cited

U.S. PATENT DOCUMENTS 9,147,719 B2    9/2015   Kim et al.
9,406,705 B2    8/2016   Kwon et al.

| | | | | |
|---|---|---|---|---|
| 2010/0271349 | A1* | 10/2010 | Liu | H01L 27/1251 |
| | | | | 438/22 |
| 2011/0049507 | A1 | 3/2011 | Choi | |
| 2011/0049523 | A1* | 3/2011 | Choi | H01L 27/1225 |
| | | | | 438/34 |
| 2011/0128211 | A1* | 6/2011 | Ono | H01L 27/1255 |
| | | | | 345/76 |
| 2015/0123084 | A1 | 5/2015 | Kim et al. | |
| 2015/0243203 | A1 | 8/2015 | Kim et al. | |
| 2015/0243718 | A1 | 8/2015 | Kwon et al. | |
| 2015/0243720 | A1* | 8/2015 | Kwon | H10D 86/421 |
| | | | | 257/40 |
| 2016/0064465 | A1* | 3/2016 | Oh | H01L 27/1251 |
| | | | | 345/212 |
| 2018/0061868 | A1* | 3/2018 | Na | H10D 86/481 |
| 2018/0061922 | A1* | 3/2018 | Kim | H10K 59/1216 |

FOREIGN PATENT DOCUMENTS

| | | | | |
|---|---|---|---|---|
| KR | 10-2010-0126418 | A | | 12/2010 |
| KR | 10-2011-0021259 | A | | 3/2011 |
| KR | 10-2011-0024935 | A | | 3/2011 |
| KR | 20110024935 | A | * | 3/2011 |
| KR | 10-2015-0051824 | A | | 5/2015 |
| KR | 20150051824 | A | * | 5/2015 |
| KR | 10-2015-0100462 | A | | 9/2015 |
| KR | 10-2015-0101418 | A | | 9/2015 |
| KR | 10-2017-0100503 | A | | 9/2017 |
| KR | 10-2017-0101203 | A | | 9/2017 |
| KR | 10-2018-0025354 | A | | 3/2018 |
| KR | 10-2018-0026610 | A | | 3/2018 |

* cited by examiner

FIG. 5

DISPLAY DEVICE

CROSS-REFERENCE TO RELATED APPLICATION

This application is a National Phase Patent Applications of International Patent Application No. PCT/KR2019/009108, filed on Jul. 23, 2019, which claims priority to and the benefit of Korean Patent Application No. 10-2018-0095664 filed in the Korean Intellectual Property Office on Aug. 16, 2018, the entire contents of which are incorporated herein by reference.

BACKGROUND

(a) Field

The present disclosure relates to a display device.

(b) Description of the Related Art

Generally, as a display device, a liquid crystal display (LCD), a light emitting diode (LED) display, and the like are used.

A light emitting diode display includes two electrodes and a light emitting layer disposed therebetween, and an electron injected from a cathode, which is one electrode, and a hole injected from an anode, which is the other electrode, are coupled with each other in the light emitting layer to generate an exciton, and the exciton emits energy to emit light.

The light emitting diode display includes a plurality of pixels including a light emitting diode including a cathode, an anode, and a light emitting layer, and each pixel includes a plurality of transistors and capacitors for driving the light emitting diode.

The transistor includes a gate electrode, a source electrode, a drain electrode, and a semiconductor layer. The semiconductor layer is an important element determining characteristics of the transistor. The semiconductor layer is mainly made of silicon (Si). Silicon is classified into amorphous silicon and polycrystalline silicon according to a crystal form. Amorphous silicon has a simple manufacturing process, but has low charge mobility, so it has limitations in manufacturing high-performance transistors, while polycrystalline silicon has high charge mobility, but requires a step of crystallizing silicon, increasing manufacturing cost and making the process complicated. Recently, research has been conducted on transistors using oxide semiconductors having higher electron mobility and a higher ON/OFF ratio than amorphous silicon and having lower cost and higher uniformity than polycrystalline silicon.

SUMMARY OF THE INVENTION

Technical Problem

Embodiments provide a display device that may reduce a time and cost required for a manufacturing process through a simple manufacturing process.

Technical Solution

A display device according to some embodiments includes: a substrate; a first transistor and a second transistor disposed on the substrate and spaced apart from each other; a first electrode connected to one of the first transistor and the second transistor; a second electrode overlapping the first electrode; and a light emitting layer between the first electrode and the second electrode, wherein the first transistor may include: a first semiconductor layer on the substrate; a first gate electrode on the first semiconductor layer; and a first source electrode and a first drain electrode connected to the first semiconductor layer, and the second transistor may include: a second semiconductor layer on the substrate; a second gate electrode on the second semiconductor layer; and a second source electrode and a second drain electrode connected to the second semiconductor layer, and the first gate electrode and the second semiconductor layer may be on the same layer.

The first gate electrode may include polycrystalline silicon doped with impurities.

The second semiconductor layer may include polycrystalline silicon.

The first semiconductor layer may include an oxide semiconductor.

The first transistor may be connected to the first electrode.

The display device may include: a buffer layer on the substrate; and a first gate insulating layer on the first semiconductor layer, and the first semiconductor layer may be between the buffer layer and the first gate insulating layer, while the second semiconductor layer and the first gate electrode may be on the first gate insulating layer.

The display device may further include a second gate insulating layer on the second semiconductor layer and the first gate electrode, and the second gate electrode may be on the second gate insulating layer.

A display device according to another embodiment includes: a substrate; a first transistor and a second transistor disposed on the substrate and spaced apart from each other; a first electrode connected to one of the first transistor and the second transistor; a second electrode overlapping the first electrode; and a light emitting layer between the first electrode and the second electrode, wherein the first transistor may include: a first semiconductor layer on the substrate; a first gate electrode on the first semiconductor layer; and a first source electrode and a first drain electrode connected to the first semiconductor layer, and the second transistor may include: a second semiconductor layer on the substrate; a second gate electrode on the second semiconductor layer; and a second source electrode and a second drain electrode connected to the second semiconductor layer, and the first semiconductor layer and the second gate electrode may be on the same layer.

The first semiconductor layer may include polycrystalline silicon, and the second semiconductor layer may include an oxide semiconductor.

The second gate electrode may include polycrystalline silicon doped with impurities.

The display device may further include: a buffer layer on the substrate; an insulating layer on the second semiconductor layer; and a first gate insulating layer on the first semiconductor layer, and the second semiconductor layer may be between the buffer layer and the insulating layer, while the first semiconductor layer may be between the insulating layer and the first gate insulating layer.

The first gate electrode may be on the first gate insulating layer, and the second gate electrode may be between the insulating layer and the first gate insulating layer.

A display device according to another embodiment includes: a substrate; a first transistor and a second transistor disposed on the substrate and spaced apart from each other; a first electrode connected to one of the first transistor and the second transistor; a second electrode overlapping the first electrode; and a light emitting layer between the first electrode and the second electrode, wherein the first transistor may include: a first gate electrode on the substrate; a first semiconductor layer on the first gate electrode; and a first source electrode and a first drain electrode connected to the first semiconductor layer, and the second transistor may include: a second semiconductor layer on the substrate; a second gate electrode on the second semiconductor layer; and a second source electrode and a second drain electrode connected to the second semiconductor layer, and the first gate electrode and the second semiconductor layer may be on the same layer.

The first gate electrode may include polycrystalline silicon doped with impurities.

The first semiconductor layer may include an oxide semiconductor.

The second semiconductor layer may include polycrystalline silicon.

The display device may further include an auxiliary metal layer on the first semiconductor layer, wherein the auxiliary metal layer and the second gate electrode may be on the same layer.

The auxiliary metal layer may be between the first semiconductor layer and the first source electrode and between the first semiconductor layer and the first drain electrode.

The auxiliary metal layer may directly contact the first semiconductor layer.

The display device may further include: a buffer layer on the substrate; and a gate insulating layer on the buffer layer, and the first gate electrode and the second semiconductor layer may be between the buffer layer and the gate insulating layer.

Advantageous Effects

According to the embodiments, it is possible to provide a display device that may reduce a time and cost required for a manufacturing process through a simple manufacturing process.

BRIEF DESCRIPTION OF THE DRAWINGS

FIG. 5, FIG. 6, FIG. 7, and FIG. 8 respectively illustrate a cross-sectional view of a partial area of a display device according to a manufacturing process.

DETAILED DESCRIPTION OF THE EMBODIMENTS

Figure 1:
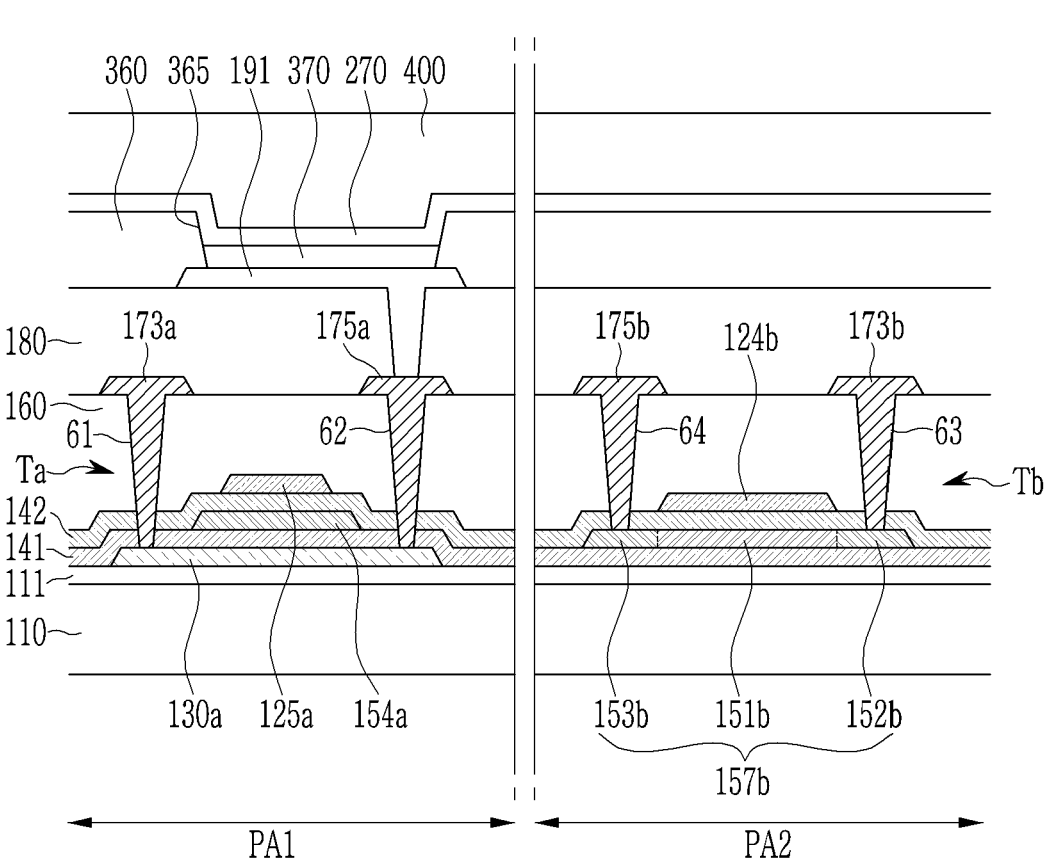
FIG. 1 illustrates a cross-sectional view a partial area of a display device according to some embodiments.

The present invention will be described more fully hereinafter with reference to the accompanying drawings, in which embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc. are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned (or disposed) on or below the object portion, and does not necessarily mean positioned (or disposed) on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-section" or "on a cross-section" means viewing a cross-section formed by vertically cutting a target portion from the side.

Hereinafter, a display device according to some embodiments will be described in detail with reference to the accompanying drawings. Hereinafter, a display device according to some embodiments will be described with reference to FIG. 1. FIG. 1 illustrates a cross-sectional view a partial area of a display device according to some embodiments.

Referring to FIG. 1, a substrate 110 includes a first area PA1 in which a first transistor Ta is disposed and a second area PA2 in which a second transistor Tb is disposed. First, the first area PA1 will be described, and then the second area PA2 will be described.

The substrate 110 may include a glass substrate or a substrate in which a polymer layer and a barrier layer are alternately stacked.

A buffer layer 111 is disposed on the substrate 110 corresponding to the first area PA1. The buffer layer 111 may include an inorganic insulating material such as a silicon oxide, a silicon nitride, or the like, or an organic insulating material. The buffer layer 111 may be a single layer or a multilayer. For example, when the buffer layer 111 is a double layer, a lower layer thereof may include a silicon nitride, and an upper layer thereof may include a silicon oxide.

A first semiconductor layer 130a is disposed on the buffer layer 111. The first semiconductor layer 130a according to some embodiments includes an oxide semiconductor.

The oxide semiconductor may include a combination of a metal oxide such as zinc (Zn), indium (In), gallium (Ga), tin (Sn), or titanium (Ti), or a metal such as zinc (Zn), indium (In), gallium (Ga), tin (Sn), or titanium (Ti), and an oxide thereof. More specifically, the oxide semiconductor may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), and an indium-zinc-tin oxide (IZTO).

A first gate insulating layer 141 is disposed on the first semiconductor layer 130a. The first gate insulating layer 141 may include an inorganic insulating material such as a silicon nitride, a silicon oxide, or the like, or an organic insulating material.

A first gate electrode 154a is disposed on the first gate insulating layer 141. The first gate electrode 154a overlaps the first semiconductor layer 130a.

The first gate electrode 154a according to some embodiments includes polycrystalline silicon doped with impurities. The first gate electrode 154a is in a conductive state as impurities are doped into polycrystalline silicon. An impurity doped into the first gate electrode 154a may be a group 5 element, and the first gate electrode 154a may be n+ doped.

A second gate insulating layer 142 is disposed on the first gate electrode 154a and the first gate insulating layer 141. The second gate insulating layer 142 may include an inorganic insulating material such as a silicon nitride, a silicon oxide, or the like, or an organic insulating material.

A storage electrode 125a is disposed on the second gate insulating layer 142. The storage electrode 125a may include at least one of copper, a copper alloy, aluminum, an aluminum alloy, molybdenum, and a molybdenum alloy.

A storage capacitor may be configured by overlapping the first gate electrode 154a and the storage electrode 125a in a plan view with the second gate insulating layer 142 therebetween.

A first insulating layer 160 is disposed on the storage electrode 125a and the second gate insulating layer 142. The first insulating layer 160 may include an inorganic insulating material such as a silicon nitride, a silicon oxide, and an aluminum oxide, or may include an organic insulating material.

A first source electrode 173a connected to the first semiconductor layer 130a including the oxide semiconductor and a first drain electrode 175a connected to the first semiconductor layer 130a are disposed on the first insulating layer 160.

The first source electrode 173a is connected to the first semiconductor layer 130a through a first contact hole 61 formed in the first insulating layer 160, the second gate insulating layer 142, and the first gate insulating layer 141. The first drain electrode 175a is connected to the first semiconductor layer 130a through a second contact hole 62 formed in the first insulating layer 160, the second gate insulating layer 142, and the first gate insulating layer 141.

The first source electrode 173a and the first drain electrode 175a may include a metal film including at least one of copper, a copper alloy, aluminum, an aluminum alloy, molybdenum, and a molybdenum alloy. The first source electrode 173a and the first drain electrode 175a may include a single layer or a multilayer according to embodiments.

A second insulating layer 180 is disposed on the first source electrode 173a and the first drain electrode 175a. The second insulating layer 180 covers and flattens the first source electrode 173a and the first drain electrode 175a. The second insulating layer 180 may include an organic insulating material or an inorganic insulating material.

A pixel electrode 191, which is a first electrode, is disposed on the second insulating layer 180. The pixel electrode 191 may be connected to the first drain electrode 175a through a contact hole formed in the second insulating layer 180.

A partition wall 360 overlapping the second insulating layer 180 and a portion of the pixel electrode 191 is disposed on the pixel electrode 191. The partition wall 360 has an opening 365 exposing the pixel electrode 191.

The partition wall 360 may include an organic material such as a polyacrylate resin and a polyimide resin, or a siloxane-based inorganic material.

A light emitting layer 370, which is a light emitting member, is disposed on the pixel electrode 191 exposed by the opening 365. A common electrode 270 is disposed on the light emitting layer 370 and the partition wall 360. The pixel electrode 191, the light emitting layer 370, and the common electrode 270 may form a light emitting diode.

Here, the pixel electrode 191 is an anode that is a hole injection electrode, and the common electrode 270 is a cathode that is an electron injection electrode. However, the present embodiment is not limited thereto, and the pixel electrode 191 may be a cathode and the common electrode 270 may be an anode according to a driving method of the display device. Holes and electrons are injected into the light emitting layer 370 from the pixel electrode 191 and the common electrode 270, respectively, and excitons generated by coupling the injected holes and electrons fall from an excited state to a ground state to emit light.

The light emitting layer 370 may include a low molecular organic material or a polymer organic material such as poly(3,4-ethylenedioxythiophene) (PEDOT). The light emitting layer 370 may be formed as a multilayer including a light emitting layer and at least one of a hole injecting layer, a hole transporting layer, an electron transporting layer, and an electron injecting layer. When all of these are included, the hole injection layer is disposed on the pixel electrode 191, which is an anode, and the hole transport layer, the light emitting layer, the electron transport layer, and an electron injection layer may be sequentially stacked thereon.

An encapsulation layer 400 for protecting the light emitting diode may be disposed on the common electrode 270. The encapsulation layer 400 may be sealed to the substrate 110 by a sealant. The encapsulation layer 400 may be formed of various materials such as glass, quartz, ceramic, a polymer, and metal. Meanwhile, the encapsulation layer 400 may be formed by depositing an inorganic film and an organic film on the common electrode 270 without using a sealant.

Hereinafter, the second area PA2 will be described. Detailed description of the constituent elements described in the first area PA1 will be omitted.

The buffer layer 111 is disposed on the substrate 110 corresponding to the second area PA2. In addition, the first gate insulating layer 141 is disposed on the buffer layer 111.

A second semiconductor layer 157b is disposed on the first gate insulating layer 141. The second semiconductor layer 157b includes polycrystalline silicon.

The second semiconductor layer 157b includes a source region 152b connected to a second source electrode 173b to be described later, a drain region 153b connected to a second drain electrode 175b to be described later, and a channel region 151b disposed between the source region 152b and the drain region 153b. The source region 152b and the drain region 153b are in a conductive state in which impurities are doped into polycrystalline silicon. The impurities doped into the source region 152b and the drain region 153b may be a group 5 element, and may be n+ doped.

The second gate insulating layer 142 is disposed on the second semiconductor layer 157b and the first gate insulating layer 141.

A second gate electrode 124b is disposed on the second gate insulating layer 142. The second gate electrode 124b overlaps the channel region 151b of the second semiconductor layer 157b.

The second gate electrode 124b may include at least one of copper, a copper alloy, aluminum, an aluminum alloy, molybdenum, and a molybdenum alloy.

The first insulating layer 160 is disposed on the second gate electrode 124b and the second gate insulating layer 142.

The second source electrode 173b connected to the source region 152b of the second semiconductor layer 157b and the second drain electrode 175b connected to the drain region 153b of the second semiconductor layer 157b are disposed on the first insulating layer 160.

The second source electrode 173b and the source region 152b are connected through a third contact hole 63 formed in first insulating layer 160 and the second gate insulating layer 142. In addition, the second drain electrode 175b and the drain region 153b are connected through a fourth contact hole 64 formed in the first insulating layer 160 and the second gate insulating layer 142.

In the second area PA2, the second insulating layer 180, the partition wall 360, the common electrode 270, and the encapsulation layer 400 may be sequentially stacked on the second source electrode 173b and the second drain electrode 175b.

Hereinafter, a stacking relationship between the first transistor Ta disposed in the first area PA1 and the second transistor Tb disposed in the second area PA2 will be described.

The first semiconductor layer 130a according to some embodiments is disposed between the buffer layer 111 and the first gate insulating layer 141.

The first gate electrode 154a and the second semiconductor layer 157b are disposed between the first gate insulating layer 141 and the second gate insulating layer 142. The first gate electrode 154a and the second semiconductor layer 157b are disposed on the same layer. The first gate electrode 154a and the second semiconductor layer 157b may include the same material, and may be formed through the same manufacturing process.

Since the first gate electrode 154a may be simultaneously formed in the process of forming the second semiconductor layer 157b, a separate gate electrode forming process is not required, and thus the manufacturing process of the display device may be simplified.

The first gate electrode 154a and the second semiconductor layer 157b include polycrystalline silicon. In addition, the source region 152b and the drain region 153b of the second semiconductor layer 157b and the first gate electrode 154a may include polycrystalline silicon doped with impurities.

The storage electrode 125a and the second gate electrode 124b are disposed between the second gate insulating layer 142 and the first insulating layer 160. The storage electrode 125a and the second gate electrode 124b may be formed in the same process, and may include the same material.

The display device according to some embodiments may include the first transistor Ta including an oxide semiconductor and the second transistor Tb including polycrystalline silicon. In this case, since the first gate electrode 154a included in the first transistor Ta and the second semiconductor layer 157b included in the second transistor Tb may be formed through the same process, the manufacturing process and the stacked structure may be simplified.

Hereinafter, a display device according to some embodiments will be described with reference to FIG. 2 to FIG. 4.

Figure 2:
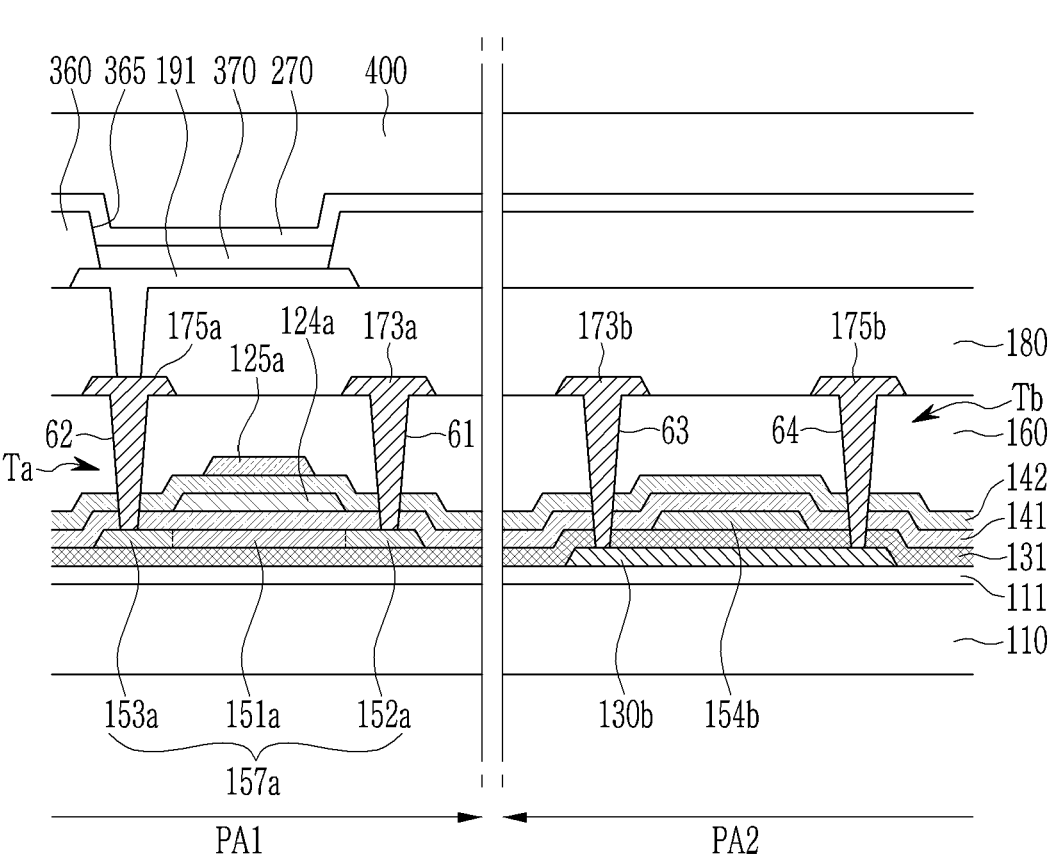
FIG. 2 illustrates a cross-sectional view a partial area of a display device according to some embodiments.
Figure 3:
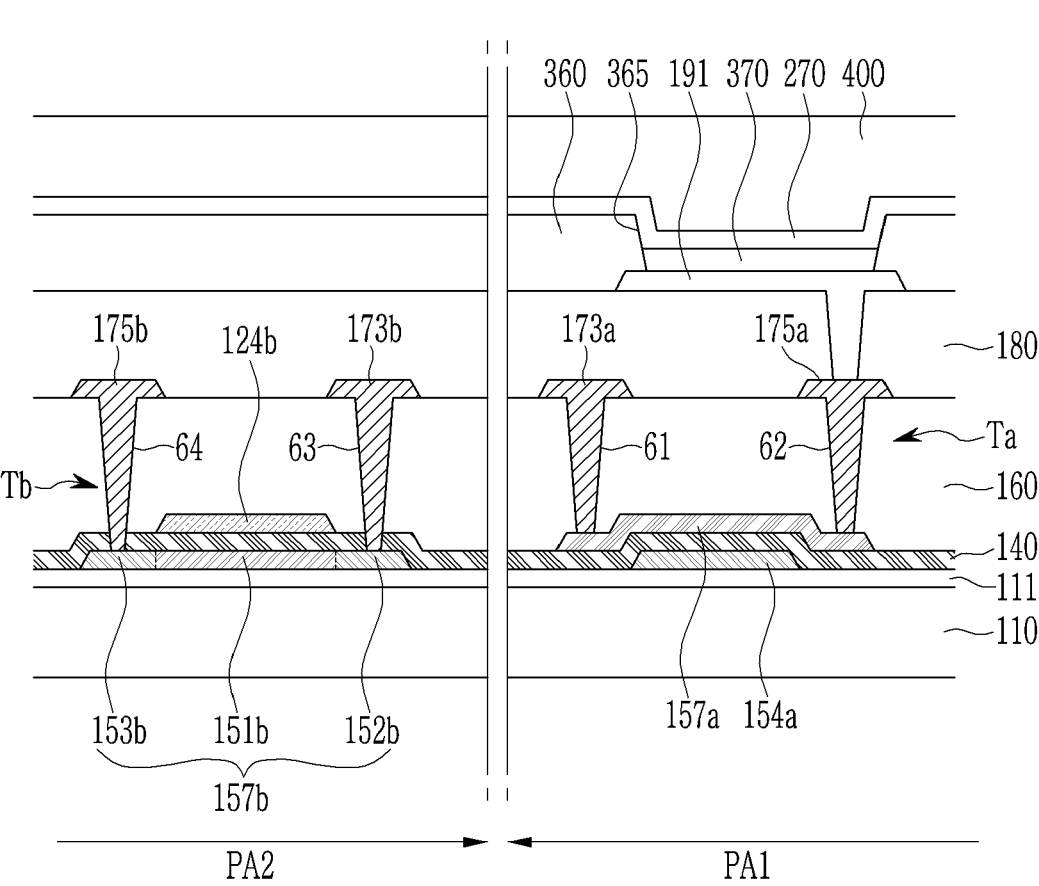
FIG. 3 illustrates a cross-sectional view a partial area of a display device according to some embodiments.
Figure 4:
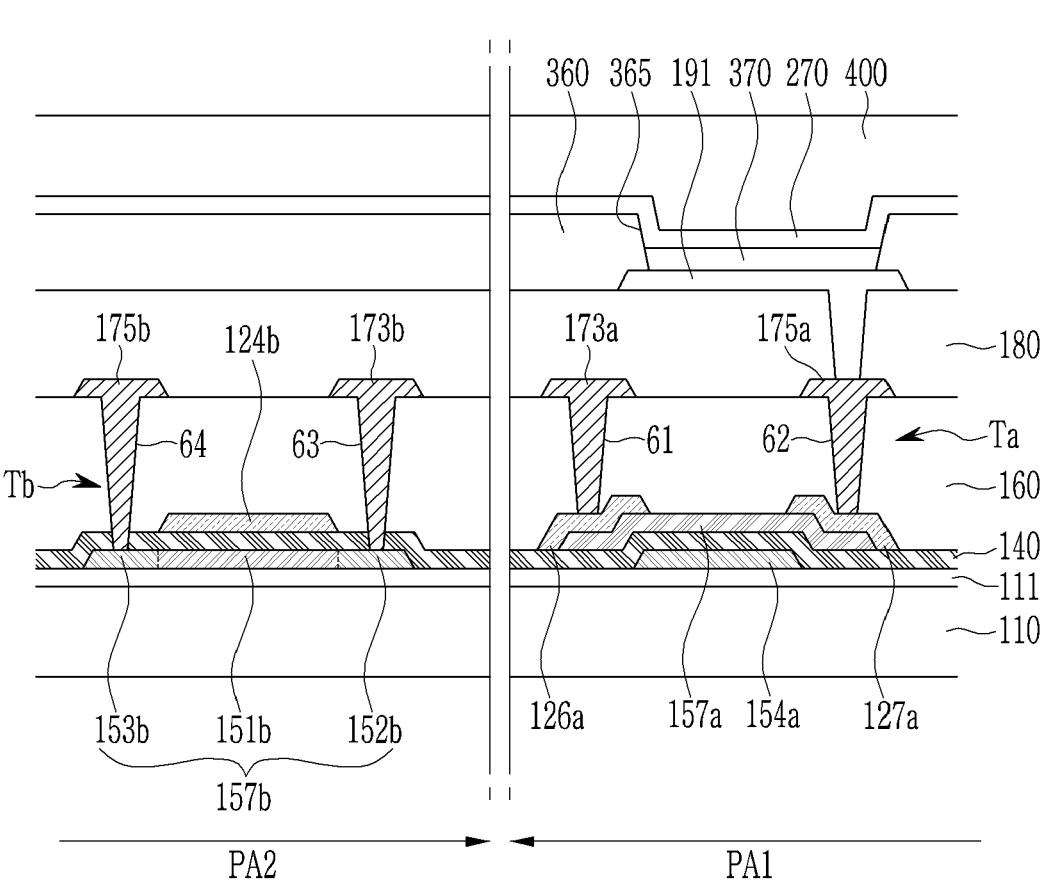
FIG. 4 illustrates a cross-sectional view a partial area of a display device according to some embodiments.

FIG. 2, FIG. 3, and FIG. 4 illustrate a cross-sectional view of a display device according to some embodiments, respectively. A description of the same or similar constituent elements as those of the embodiments described above will be omitted.

First, referring to FIG. 2, the substrate 110 includes the first area PA1 in which the first transistor Ta is disposed and the second area PA2 in which the second transistor Tb is disposed. First, the first area PA1 will be described, and then the second area PA2 will be described.

The buffer layer 111 is disposed on the substrate 110 corresponding to the first area PA1. An insulating layer 131 is disposed on the buffer layer 111. The insulating layer 131 may include an inorganic insulating material or an organic insulating material.

Next, a first semiconductor layer 157a is disposed on the insulating layer 131. The first semiconductor layer 157a includes polycrystalline silicon.

The first semiconductor layer 157a includes a source region 152a connected to a first source electrode 173a to be described later, a drain region 153a connected to a first drain electrode 175a, and a channel region 151a disposed between the source region 152a and the drain region 153a. The source region 152a and the drain region 153a are in a conductive state in which impurities are doped.

The first gate insulating layer 141 is disposed on the insulating layer 131 and the first semiconductor layer 157a.

A first gate electrode 124a is disposed on the first gate insulating layer 141. The first gate electrode 124a overlaps the channel region 151a of the first semiconductor layer 157a. The first gate electrode 124a may include at least one of copper, a copper alloy, aluminum, an aluminum alloy, molybdenum, and a molybdenum alloy.

A second gate insulating layer 142 is disposed on the first gate electrode 124a and the first gate insulating layer 141.

A storage electrode 125a is disposed on the second gate insulating layer 142. Although not shown in the present specification, the storage electrode 125a may be connected to a separate driving voltage line and the like.

The storage electrode 125a and the first gate electrode 124a may form a storage capacitor by overlapping each other with the second gate insulating layer 142 therebetween.

A first insulating layer 160 is disposed on the storage electrode 125a and the second gate insulating layer 142.

The first source electrode 173a and the source region 152a of the first semiconductor layer 157a are connected through the first contact hole 61 formed in the first insulating layer 160, the second gate insulating layer 142, and the first gate insulating layer 141. The first drain electrode 175a and the drain region 153a of the first semiconductor layer 157a are connected through the second contact hole 62 of the first insulating layer 160, the second gate insulating layer 142, and the first gate insulating layer 141.

A second insulating layer 180 is disposed on the first source electrode 173a and the first drain electrode 175a.

A pixel electrode 191, which is a first electrode, is disposed on the second insulating layer 180. The pixel electrode 191 may be connected to the first drain electrode 175a through a contact hole formed in the second insulating layer 180.

A partition wall 360 overlapping the second insulating layer 180 and a portion of the pixel electrode 191 is disposed on the pixel electrode 191. A light emitting layer 370, which is a light emitting member, is disposed on the pixel electrode 191 exposed by the opening 365 included in the partition wall 360. A common electrode 270 is disposed on the light emitting layer 370 and the partition wall 360. The pixel electrode 191, the light emitting layer 370, and the common electrode 270 may form a light emitting diode. An encapsulation layer 400 for protecting the light emitting diode may be disposed on the common electrode 270.

Hereinafter, the second transistor Tb disposed in the second area PA2 will be described.

The buffer layer 111 is disposed on the substrate 110, and a second semiconductor layer 130b is disposed on the buffer layer 111.

The second semiconductor layer 130b according to some embodiments includes an oxide semiconductor. The oxide semiconductor may include a combination of a metal oxide such as zinc (Zn), indium (In), gallium (Ga), tin (Sn), or titanium (Ti), or a metal such as zinc (Zn), indium (In), gallium (Ga), tin (Sn), or titanium (Ti), and an oxide thereof. More specifically, the oxide semiconductor may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), and an indium-zinc-tin oxide (IZTO).

The insulating layer 131 is disposed on the second semiconductor layer 130b and the buffer layer 111. The insulating layer 131 may include an inorganic insulating material or an organic insulating material. A second gate electrode 154b is disposed on the insulating layer 131.

The second gate electrode 154b may include polycrystalline silicon doped with impurities. The second gate electrode 154b is in a conductive state as impurities are doped into polycrystalline silicon.

The first gate insulating layer 141, the second gate insulating layer 142, and the first insulating layer 160 are sequentially disposed on the insulating layers 131 and the second gate electrodes 154b.

A second source electrode 173b connected to the second semiconductor layer 130b and a second drain electrode 175b connected to the second semiconductor layer 130b are disposed on the first insulating layer 160.

The second source electrode 173b may be connected to the second semiconductor layer 130b through the third contact hole 63, and the second drain electrode 175b may be connected to the second semiconductor layer 130b through the fourth contact hole 64.

The second insulating layer 180, the partition wall 360, the common electrode 270, and the encapsulation layer 400 are sequentially disposed on the second source electrode 173b and the second drain electrode 175b.

Hereinafter, a stacking relationship between the first transistor Ta disposed in the first area PA1 and the second transistor Tb disposed in the second area PA2 will be described.

The second semiconductor layer 130b is disposed between the buffer layer 111 and the insulating layer 131. The first semiconductor layer 157a and the second gate electrode 154b are disposed between the insulating layer 131 and the first gate insulating layer 141. The first semiconductor layer 157a and the second gate electrode 154b are disposed on the same layer. The first semiconductor layer 157a and the second gate electrode 154b may include the same material, and may be formed through the same manufacturing process.

The first semiconductor layer 157a and the second gate electrode 154b include polycrystalline silicon. The source region 152a and the drain region 153a of the first semiconductor layer 157a and the second gate electrode 154b may include polycrystalline silicon doped with impurities.

Since the second gate electrode 154b may be simultaneously formed in the process of forming the first semiconductor layer 157a, a separate gate electrode forming process is not required, and thus the manufacturing process may be simplified.

The display device according to some embodiments may include the first transistor Ta including polycrystalline silicon and the second transistor Tb including an oxide semiconductor. In this case, since the first semiconductor layer 157a included in the first transistor Ta and the second gate electrode 154b included in the second transistor Tb may be formed through the same process, the manufacturing process and the stacked structure may be simplified.

Hereinafter, it will be described with reference to FIG. 3. In FIG. 3, the first area PA1 in which the first transistor Ta is disposed will be first described.

Referring to FIG. 3, the first gate electrode 154a is disposed on the buffer layer 111. The first gate electrode 154a may include polycrystalline silicon doped with impurities.

A gate insulating layer 140 is disposed on the first gate electrode 154a and the buffer layer 111.

The first semiconductor layer 157a is disposed on the gate insulating layer 140. The first semiconductor layer 157a according to some embodiments may include an oxide semiconductor.

The first insulating layer 160 is disposed on the first semiconductor layer 157a. A first source electrode 173a connected to a first semiconductor layer 157a including an oxide semiconductor through a first contact hole 61 and a first drain electrode 175a connected to the first semiconductor layer 157a through a second contact hole 62 are disposed on the first insulating layer 160.

Next, the second area PA2 in which the second transistor Tb is disposed will be described.

The second semiconductor layer 157b is disposed on the buffer layer 111 disposed on the substrate 110. The second semiconductor layer 157b includes polycrystalline silicon.

The second semiconductor layer 157b includes a source region 152b connected to a second source electrode 173b, a drain region 153b connected to a second drain electrode 175b, and a channel region 151b disposed between the source region 152b and the drain region 153b. The source region 152b and the drain region 153b are in a conductive state in which impurities are doped.

The gate insulating layer 140 is disposed on the second semiconductor layer 157b and the buffer layer 111. A second gate electrode 124b is disposed on the gate insulating layer 140. The second gate electrode 124b may overlap the channel region 151b of the second semiconductor layer 157b.

The second gate electrode 124b may include a metal film including at least one of copper, a copper alloy, aluminum, an aluminum alloy, molybdenum, and a molybdenum alloy. The second gate electrode 124b may include a single film or multi-film according to some embodiments.

The first insulating layer 160 is disposed on the second gate electrode 124b and the gate insulating layer 140.

The second source electrode 173b is connected to the source region 152b through the third contact hole 63 formed in the first insulating layer 160 and the gate insulating layer 140. The second drain electrode 175b is connected to the drain region 153b through the fourth contact hole 64 formed in the first insulating layer 160 and the gate insulating layer 140.

The first gate electrode 154a and the second semiconductor layer 157b according to some embodiments may be disposed between the buffer layer 111 and the gate insulating layer 140. The first gate electrode 154a and the second semiconductor layer 157b are disposed on the same layer. The first gate electrode 154a and the second semiconductor layer 157b may include the same material, and may be formed through the same manufacturing process.

The first gate electrode 154a and the second semiconductor layer 157b include polycrystalline silicon. In addition, the source region 152b and the drain region 153b of the second semiconductor layer 157b and the first gate electrode 154a may be doped with impurities in polycrystalline silicon.

Since the first gate electrode 154a may be simultaneously formed in the process of forming the second semiconductor layer 157b, a separate gate electrode forming process is not required, and thus a process therefor may be simplified.

Although the present specification shows the configuration in which the light emitting diode is connected to the first transistor Ta in FIG. 3, the present invention is not limited thereto, and the light emitting diode may be connected to the second transistor Tb.

Hereinafter, it will be described with reference to FIG. 4. Referring to FIG. 4, auxiliary metal layers 126a and 127a are disposed on the first semiconductor layer 157a disposed in the first area PA. The first insulating layer 160 is disposed on the auxiliary metal layers 126a and 127a.

The first source electrode 173a and the first drain electrode 175a are disposed on the first insulating layer 160. The first source electrode 173a is connected to the auxiliary metal layer 126a through the first contact hole 61 formed in the first insulating layer 160. The first drain electrode 175a may be connected to the auxiliary metal layer 127a through the second contact hole 62 formed in the first insulating layer 160.

The auxiliary metal layers 126a and 127a may be disposed on the same layer as the second gate electrode 124b. The auxiliary metal layers 126a and 127a and the second gate electrode 124b may be disposed between the gate insulating layer 140 and the first insulating layer 160.

Hereinafter, a manufacturing method of the display device according to some embodiments will be described with reference to FIG. 5 to FIG. 8. FIG. 5, FIG. 6, FIG. 7, and FIG. 8 respectively illustrate a cross-sectional view of a partial area of a display device according to a manufacturing process.

Figure 5:
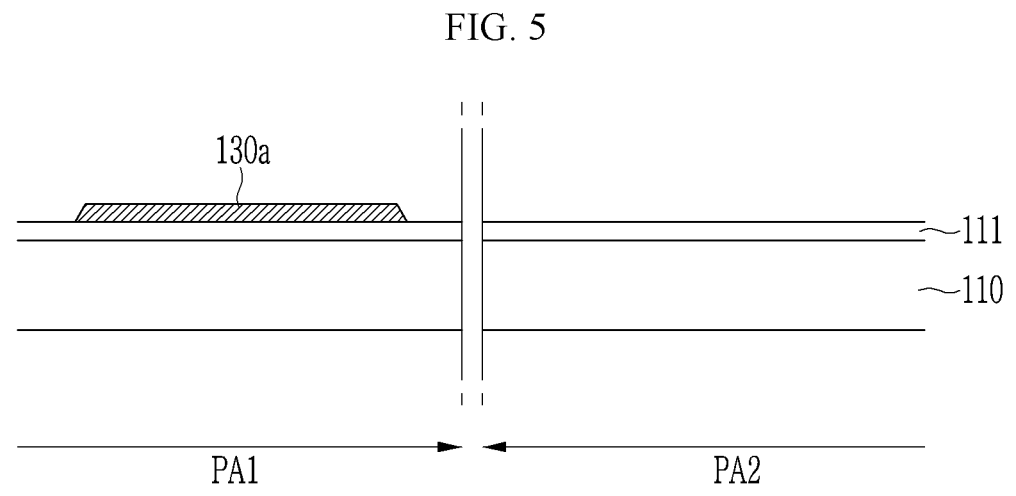

First, as shown in FIG. 5, the substrate 110 includes the first area PA1 and the second area PA2. The buffer layer 111 is disposed on the entire surface of the substrate 110 so as to overlap the first area PA1 and the second area PA2. In addition, the first semiconductor layer 130a including an oxide semiconductor is formed in the first area PA1.

Figure 6:
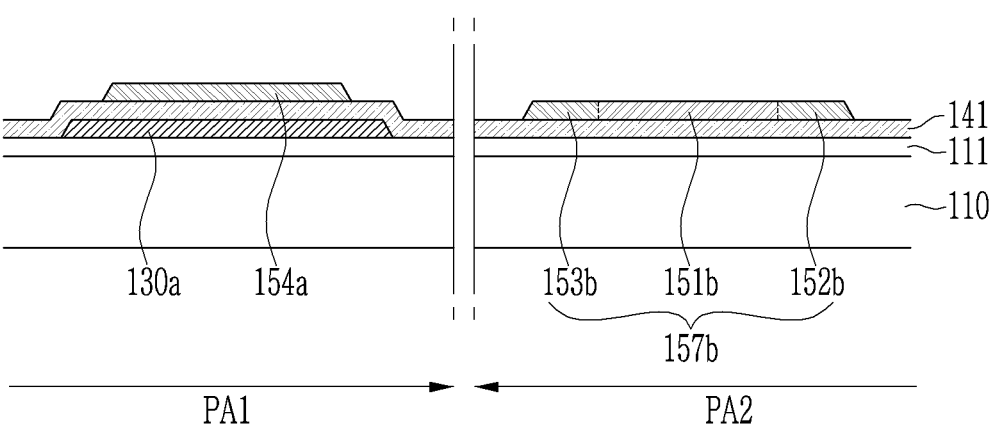

Next, as shown in FIG. 6, the first gate insulating layer 141 overlapping the entire surface of the substrate 110 is formed on the buffer layer 111 and the first semiconductor layer 130a.

The second semiconductor layer 157b is formed on the first gate insulating layer 141 disposed in the second area PA2, and the first gate electrode 154a is formed on the first gate insulating layer 141 disposed in the first area PA1. The first gate electrode 154a and the second semiconductor layer 157b are formed on the same layer.

The first gate electrode 154a and the second semiconductor layer 157b include polycrystalline silicon. In addition, the source region 152b and the drain region 153b of the second semiconductor layer 157b and the first gate electrode 154a may be doped with impurities in polycrystalline silicon.

Since the first gate electrode 154a may be simultaneously formed in the process of forming the second semiconductor layer 157b, a separate gate electrode forming process is not required, and thus a process therefor may be simplified.

Figure 7:
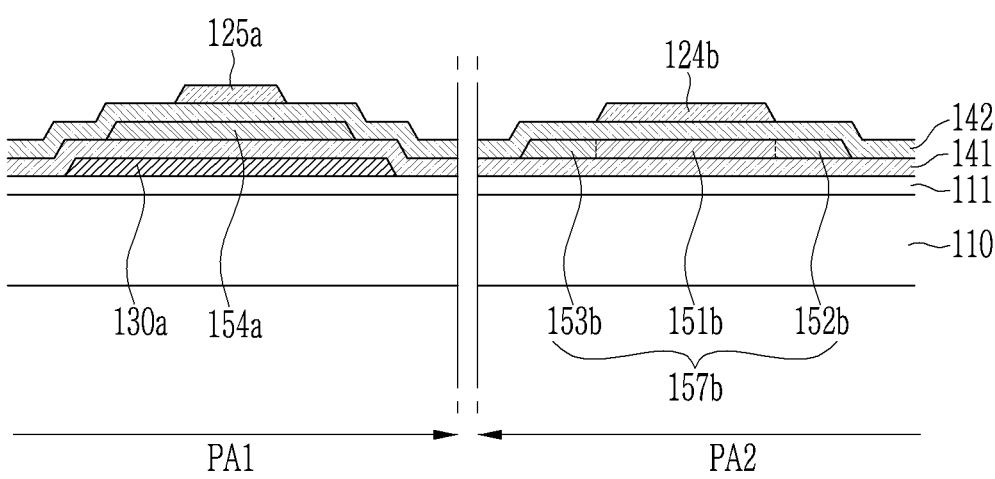

As shown in FIG. 7, the second gate insulating layer 142 overlapping the entire surface of the substrate 110 is formed on the first gate electrode 154a, the second semiconductor layer 157b, and the first gate insulating layer 141. Then, the storage electrode 125a and the second gate electrode 124b are formed on the second gate insulating layer 142.

Figure 8:
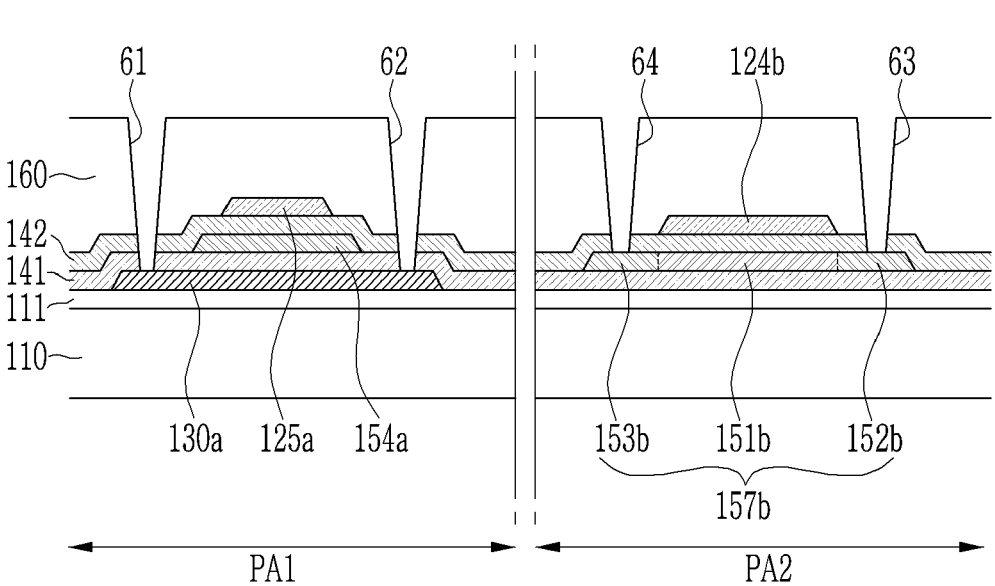

Next, as shown in FIG. 8, the first insulating layer 160 overlapping the entire surface of the substrate 110 is formed. The first insulating layer 160, the second gate insulating layer 142, and the first gate insulating layer 141 have the first contact hole 61 and the second contact hole 62 exposing a portion of the first semiconductor layer 130a. In addition, the first insulating layer 160 and the second gate insulating layer 142 have the third contact hole 63 exposing a portion of the source region 152b and the fourth contact hole 64 exposing a portion of the drain region 153b.

Next, the first source electrode 173a, the first drain electrode 175a, the second source electrode 173b, and the second drain electrode 175b are formed on the first insulating layer 160, and then the light emitting diode connected to the first drain electrode 175a is formed, thereby providing the display device as shown in FIG. 1.

Figure 9:
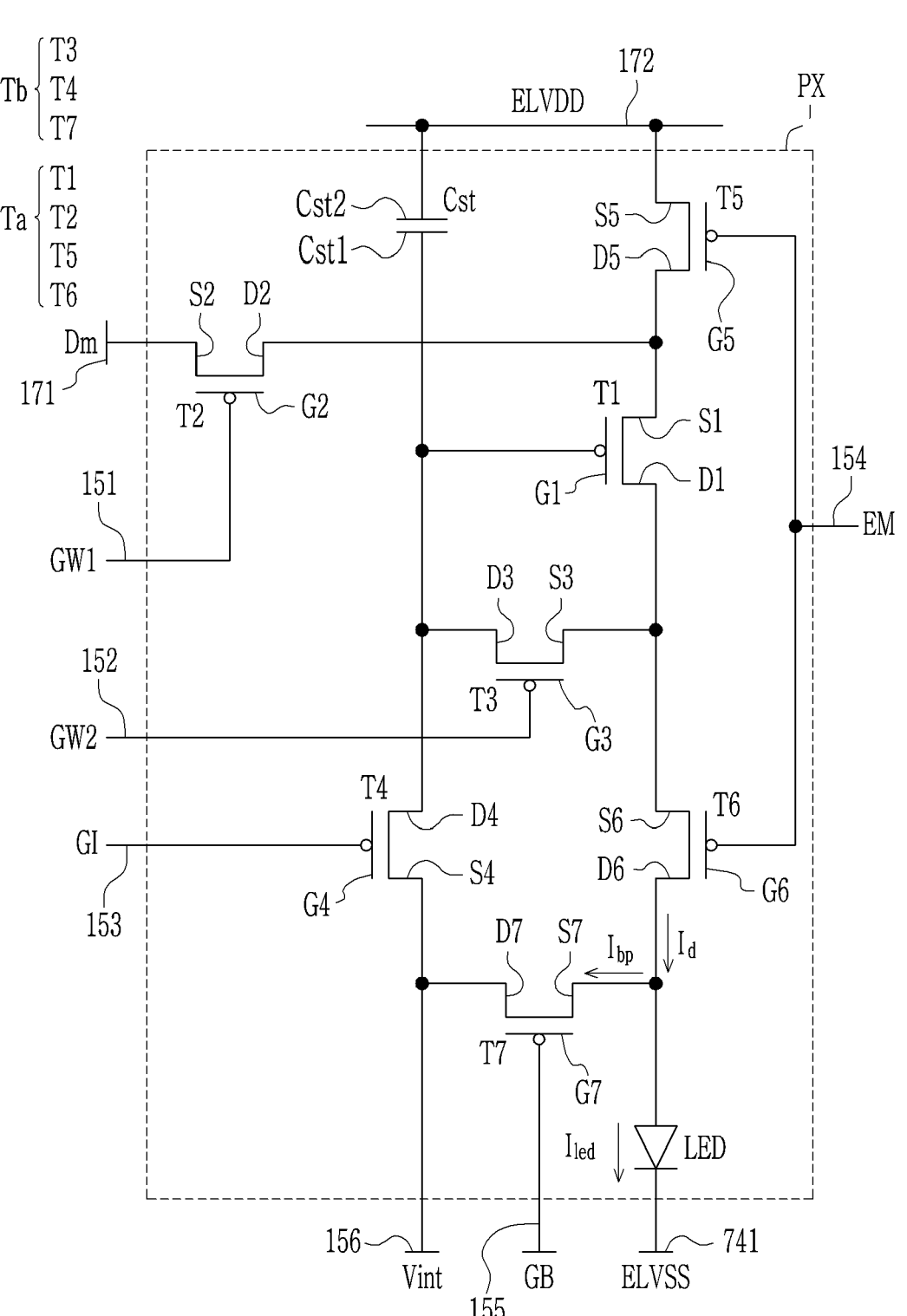
FIG. 9 illustrates an equivalent circuit diagram of one pixel of a display device according to some embodiments.

Hereinafter, a display device according to some embodiments will be described with reference to FIG. 9. FIG. 9 illustrates an equivalent circuit diagram of one pixel of a display device according to some embodiments.

As shown in FIG. 9, one pixel PX of the display device according to some embodiments may include a plurality of transistors T1, T2, T3, T4, T5, T6, and T7 connected to a plurality of signal lines 151, 152, 153, 154, 155, 156, 171, and 172, a storage capacitor Cst, and a light emitting diode LED. Although a structure including seven transistors and one capacitor is shown in the present embodiment, the present embodiment is not necessarily limited thereto, and the number of transistors and the number of capacitors may be variously changed.

The transistors T1, T2, T3, T4, T5, T6, and T7 may include the first transistor Ta including an oxide semiconductor and the second transistor Tb including polycrystalline silicon. The first transistor Ta may include a driving transistor T1, a switching transistor T2, an operation control transistor T5, and a light emission control transistor T6. The second transistor Tb may include a compensation transistor T3, an initialization transistor T4, and a bypass transistor T7, but is not limited thereto.

The signal lines 151, 152, 153, 154, 155, 156, 171, and 172 may include a first scan line 151, a second scan line 152, a third scan line 153, an emission control line 154, a bypass control line 155, an initialization voltage line 156, a data line 171, and a driving voltage line 172. The first scan line 151, the second scan line 152, the third scan line 153, the emission control line 154, the bypass control line 155, the initialization voltage line 156, the data line 171, and the driving voltage line 172 may be connected to one pixel PX.

The first scan line 151 may transmit a first scan signal GW1 to the switching transistor T2, the second scan line 152 may transmit a second scan signal GW2 to the compensation transistor T3, and the third scan line 153 may transmit a third scan signal GI to the initialization transistor T4. In addition, the emission control line 154 may transmit an emission control signal EM to the operation control transistor T5 and the emission control transistor T6, and the bypass control line 155 may transmit a bypass signal GB to the bypass transistor T7. Further, the initialization voltage line 156 may transmit an initialization voltage Vint that initializes the driving transistor T1.

The data line 171 may transmit a data signal Dm, and the driving voltage line 172 may transmit a driving voltage ELVDD.

A gate electrode G1 of the driving transistor T1 is connected to one end Cst1 of the storage capacitor Cst, and a source electrode S1 of the driving transistor T1 is connected to the driving voltage line 172 via the operation control transistor T5. A drain electrode D1 of the driving transistor T1 may be electrically connected to an anode of the light emitting diode LED via the light emission control transistor T6. The driving transistor T1 may receive the data signal Dm in accordance with a switching operation of the switching transistor T2 to supply a driving current Id to the light emitting diode LED.

A gate electrode G2 of the switching transistor T2 may be connected to the first scan line 151, a source electrode S2 of the switching transistor T2 may be connected to the data line 171, and a drain electrode D2 of the switching transistor T2 may be connected to the source electrode S1 of the driving transistor T1 and may be connected to the driving voltage line 172 via the operation control transistor T5. The switching transistor T2 may be turned on in response to the first scan signal GW1 transmitted through the first scan line 151 to perform a switching operation to transmit the data signal Dm transmitted to the data line 171 to the source electrode S1 of the driving transistor T1.

A gate electrode G3 of the compensation transistor T3 may be connected to the second scan line 152, a source electrode S3 of the compensation transistor T3 may be connected to the drain electrode D1 of the driving transistor T1 and may be connected to the anode of the light emitting diode LED via the emission control transistor T6, and a drain electrode D3 of the compensation transistor T3 may be connected to the drain electrode D4 of the initialization transistor T4, one end Cst1 of the storage capacitor Cst, and the gate electrode G1 of the driving transistor T1. The compensation transistor T3 may be turned on depending on the second scan signal GW2 transmitted through the second scan line 152 to connect the gate electrode G1 and the drain electrode D1 of the driving transistor T1 to each other to diode-connect the driving transistor T1. According to an example, the second scan signal GW2 is a signal in which a level of the first scan signal GW1 is inverted, and thus, when the first scan signal GW1 is at a high level, the second scan signal GW2 may be at a low level, while when the first scan signal GW1 is at a low level, the second scan signal GW2 may be at a high level.

A gate electrode G4 of the initialization transistor T4 may be connected to the third scan line 153, a source electrode S4 of the initialization transistor T4 may be connected to the initialization voltage line 156, and a drain electrode D4 of the initialization transistor T4 may be connected to the one end Cst1 of the storage capacitor Cst, the gate electrode G1 of the driving transistor T1, and the drain electrode D3 of the compensation transistor T3. The initialization transistor T4 may be turned on according to the third scan signal GI transmitted through the third scan line 153 to transmit the initialization voltage Vint to the gate electrode G1 of the driving transistor T1 to perform an initializing operation to initialize a gate voltage Vg of the gate electrode G1 of the driving transistor T1.

A gate electrode G5 of the operation control transistor T5 may be connected to the emission control line 154, a source electrode S5 of the operation control transistor T5 may be connected to the driving voltage line 172, and a drain electrode D5 of the operation control transistor T5 may be connected to the source electrode S1 of the driving transistor T1 and the drain electrode S2 of the switching transistor T2.

A gate electrode G6 of the emission control transistor T6 may be connected to the emission control line 154, a source electrode S6 of the emission control transistor T6 may be connected to the drain electrode D1 of the driving transistor T1 and the source electrode S3 of the compensation transistor T3, and a drain electrode D6 of the emission control transistor T6 may be electrically connected to the anode of the light emitting diode LED. The operation control transistor T5 and the emission control transistor T6 may be simultaneously turned on according to an emission control signal EM transmitted through the emission control line 154, thus the driving voltage ELVDD may be compensated through the diode-connected driving transistor T1 and then may be transmitted to the light emitting diode LED.

A gate electrode G7 of the bypass transistor T7 may be connected to the bypass control line 155, a source electrode S7 of the bypass transistor T7 may be connected together to the drain electrode D6 of the emission control transistor T6 and the anode of the light emitting diode LED, and a drain electrode D7 of the bypass transistor T7 may be connected together to the initialization voltage line 156 and the source electrode S4 of the initialization transistor T4.

The other end Cst2 of the storage capacitor Cst may be connected to the driving voltage line 172, and the cathode of the light emitting diode LED may be connected to a driving voltage line 741 for transmitting the common voltage ELVSS.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a first transistor and a second transistor disposed on the substrate and spaced apart from each other;
   a first electrode electrically connected to one of the first transistor and the second transistor;
   a second electrode overlapping the first electrode;
   a light emitting layer between the first electrode and the second electrode; and
   a first gate insulating layer,
   wherein the first transistor includes:
     a first semiconductor layer on the substrate below the first gate insulating layer, the first semiconductor layer including an oxide semiconductor;
     a first gate electrode on the first semiconductor layer; and
     a first source electrode and a first drain electrode electrically connected to the first semiconductor layer,
   wherein the second transistor includes:
     a second semiconductor layer on the substrate above the first gate insulating layer, the second semiconductor layer including polycrystalline silicon;
     a second gate electrode on the second semiconductor layer; and
     a second source electrode and a second drain electrode electrically connected to the second semiconductor layer, wherein the first gate electrode and the second semiconductor layer are at a same layer, wherein the first semiconductor layer is disposed closer to the substrate than, and is at a different layer than, the second semiconductor layer, and wherein the first gate electrode is disposed closer to the substrate than, and is at a different layer than, the second gate electrode.

2. The display device of claim 1, wherein the display device further includes: a buffer layer on the substrate, and wherein the first semiconductor layer is between the buffer layer and the first gate insulating layer, while the second semiconductor layer and the first gate electrode are on the first gate insulating layer.

3. The display device of claim 2, wherein the display device further includes a second gate insulating layer on the second semiconductor layer and the first gate electrode, and wherein the second gate electrode is on the second gate insulating layer.

4. The display device of claim 1, wherein the first gate electrode includes polycrystalline silicon doped with impurities.

5. The display device of claim 1, wherein the first transistor is connected to the first electrode.

6. A display device comprising:

a substrate;

a first transistor and a second transistor disposed on the substrate and spaced apart from each other;

a storage electrode;

a first electrode electrically connected to the first transistor;

a second electrode overlapping the first electrode;

a light emitting layer between the first electrode and the second electrode; and a first gate insulating layer, wherein the first transistor includes:

a first semiconductor layer on the substrate above the first gate insulating layer, the first semiconductor layer including polycrystalline silicon;

a first gate electrode above the first semiconductor layer and below the storage electrode while overlapping the storage electrode in a thickness direction; and a first source electrode and a first drain electrode electrically connected to the first semiconductor layer, wherein the second transistor includes:

a second semiconductor layer on the substrate below the first gate insulating layer, the second semiconductor layer including an oxide semiconductor;

a second gate electrode on the second semiconductor layer; and a second source electrode and a second drain electrode connected to the second semiconductor layer, wherein the first semiconductor layer and the second gate electrode are at a same layer, the second gate electrode including polycrystalline silicon, wherein the second semiconductor layer is disposed closer to the substrate than, and is at a different layer than, the first semiconductor layer, and wherein the second gate electrode is disposed closer to the substrate than, and is at a different layer than, the first gate electrode.

7. The display device of claim 6, wherein the display device further includes:

a buffer layer on the substrate; and an insulating layer on the second semiconductor layer, and wherein the second semiconductor layer is between the buffer layer and the insulating layer, and the first semiconductor layer is between the insulating layer and the first gate insulating layer.

8. The display device of claim 7, wherein the first gate electrode is on the first gate insulating layer, and wherein the second gate electrode is between the insulating layer and the first gate insulating layer.

9. The display device of claim 6, wherein the second gate electrode includes polycrystalline silicon doped with impurities.

* * * * *